United States Patent
Weis

(10) Patent No.: US 7,605,037 B2
(45) Date of Patent: Oct. 20, 2009

(54) MANUFACTURING METHOD FOR AN INTEGRATED SEMICONDUCTOR MEMORY DEVICE AND CORRESPONDING SEMICONDUCTOR MEMORY DEVICE

(75) Inventor: Rolf Weis, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/704,783

(22) Filed: Feb. 9, 2007

(65) Prior Publication Data
US 2008/0192526 A1    Aug. 14, 2008

(51) Int. Cl.
H01L 21/336    (2006.01)
(52) U.S. Cl. .................. 438/270; 438/253; 438/396; 257/306; 257/E21.648
(58) Field of Classification Search ............... 438/142, 438/197, 238, 253, 254, 270, 397, 398, 396; 257/204, 306, 311, E29.2, E29.201, E29.26, 257/905, 906, 907, 908
See application file for complete search history.

(56) References Cited

U.S. PATENT DOCUMENTS

| | | | |
|---|---|---|---|
| 5,877,522 A | 3/1999 | Kasai | |
| 6,329,241 B1 | 12/2001 | Lin | |
| 7,034,408 B1 * | 4/2006 | Schloesser | 257/213 |
| 7,139,184 B2 * | 11/2006 | Schloesser | 365/53 |
| 2006/0281250 A1 | 12/2006 | Schloesser | |

FOREIGN PATENT DOCUMENTS

DE    10 2005 057070    7/2006

OTHER PUBLICATIONS

German Office Action dated Dec. 17, 2007.

* cited by examiner

*Primary Examiner*—Brook Kebede
(74) *Attorney, Agent, or Firm*—Fay Kaplun & Marcin, LLP

(57) ABSTRACT

The present invention provides an integrated semiconductor memory device comprising: a semiconductor substrate; a plurality of active area lines formed in said semiconductor substrate, each of which active area lines includes a plurality of memory cell selection transistors having a respective wordline contact, bitline contact, and node contact; a plurality of filled insulation trenches arranged between said active area lines; a plurality of rewiring stripes each of which rewires an associated node contact of a memory cell selection transistor from an active area line to above a neighboring filled insulation trench so as to form a respective rewired node contact; a plurality of bitlines being aligned with and running above said active area lines which bitlines are connected to the bitline contacts of the memory cell selection transistors of the respective active area lines; a plurality of wordlines running perpendicular to said bitlines which are connected to the wordline contacts of the memory cell selection transistors of corresponding active area lines; and a plurality of memory cell capacitors each of which is connected to a respective rewired node contact of an associated memory cell selection transistor. The present invention also provides a corresponding manufacturing method for an integrated semiconductor memory device and a memory cell.

17 Claims, 17 Drawing Sheets

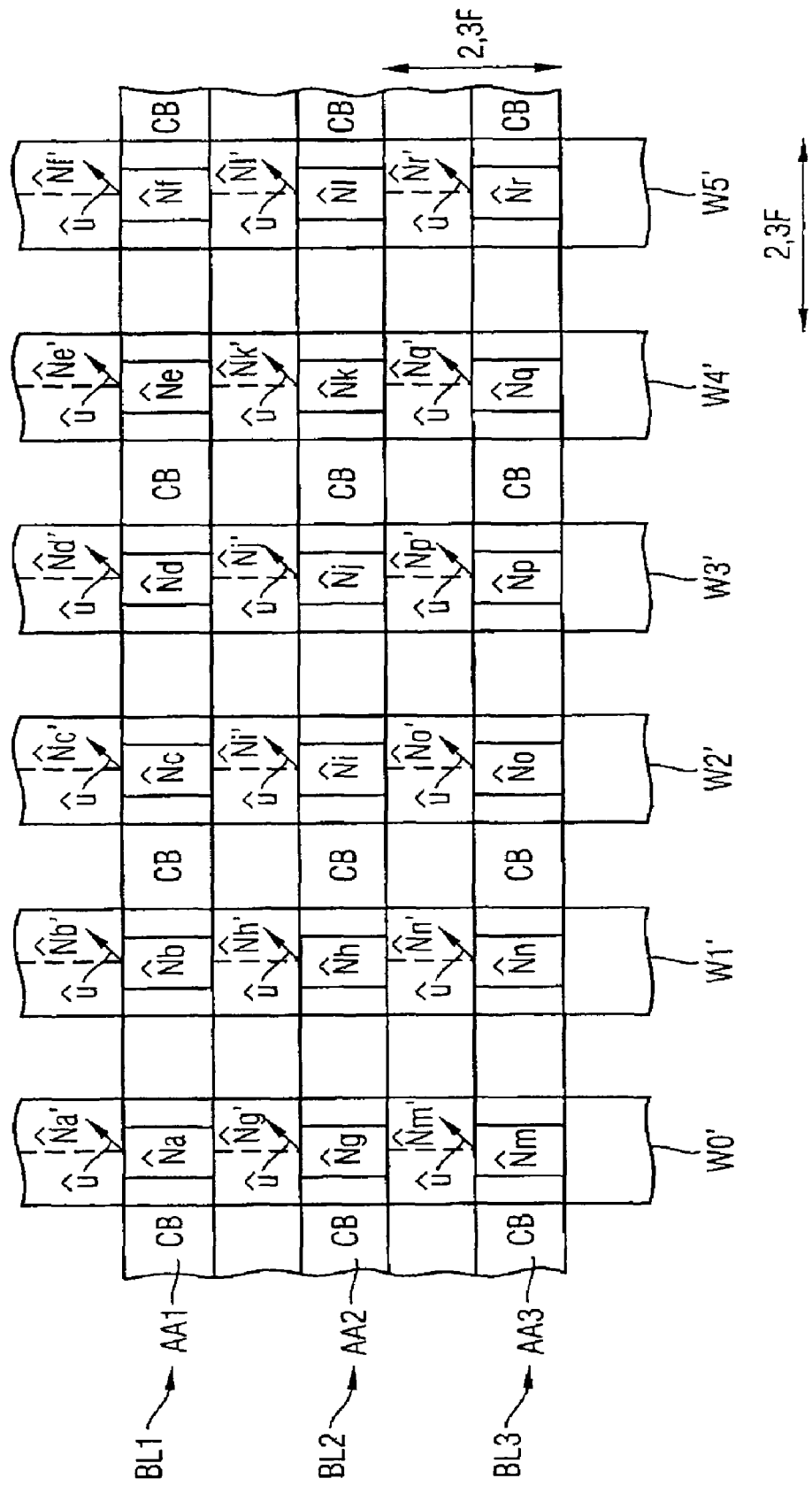

MANUFACTURING METHOD FOR AN INTEGRATED SEMICONDUCTOR MEMORY DEVICE AND CORRESPONDING SEMICONDUCTOR MEMORY DEVICE

BACKGROUND OF THE INVENTION

1. Field of the Invention

The present invention relates to a manufacturing method for an integrated semiconductor memory device and to a corresponding semiconductor memory device.

2. Description of the Related Art

Although in principle applicable to arbitrary integrated semiconductor memory devices, the following invention and the underlying problems will be explained with respect to integrated DRAM memory circuits in silicon technology. In particular, DRAM technology which is scaled down to below 100 nm generation provides big challenges.

Stack DRAM memory cell arrays of today have angled active area lines in respect to the bitlines in order to take into account that the node contacts (contacts of the selection transistors to the cell capacitors) have to pass by the bitlines to contact the capacitor above the bitline and that the bitline contacts must be centered under the respective bitlines.

Angled active area lines have disadvantages in respect to the array edges, as it is difficult to find space-saving printable solutions to terminate the lines. Angled active area lines create more overlay sensitivity for the array devices where usually the wordlines run perpendicular to the bitlines. Angled active area lines also reduce the contact area for the node contacts and the bitline contacts.

BRIEF SUMMARY OF THE INVENTION

According to a first aspect of the invention as claimed in claim 1, a manufacturing method for an integrated semiconductor memory device comprising the steps of: providing a semiconductor substrate; forming a plurality of active area lines in said semiconductor substrate, each of which active area lines includes a plurality of memory cell selection transistors having a respective wordline contact, bitline contact, and node contact; forming a plurality of filled insulation trenches arranged between said active area lines; forming a plurality of rewiring stripes each of which rewires an associated node contact of a memory cell selection transistor from an active area line to above a neighboring filled insulation trench so as to form a respective rewired node contact; forming a plurality of bitlines being aligned with and running above said active area lines which bitlines are connected to the bitline contacts of the memory cell selection transistors of the respective active area lines; forming a plurality of wordlines running perpendicular to said bitlines which are connected to the wordline contacts of the memory cell selection transistors of corresponding active area lines; and forming a plurality of memory cell capacitors each of which is connected to a respective rewired node contact of an associated memory cell selection transistor.

According to a second aspect of the present invention as claimed in claim 10, an integrated semiconductor memory device comprises: a semiconductor substrate; a plurality of active area lines formed in said semiconductor substrate, each of which active area lines includes a plurality of memory cell selection transistors having a respective wordline contact, bitline contact, and node contact; a plurality of filled insulation trenches arranged between said active area lines; a plurality of rewiring stripes each of which rewires an associated node contact of a memory cell selection transistor from an active area line to above a neighboring filled insulation trench so as to form a respective rewired node contact; a plurality of bitlines being aligned with and running above said active area lines which bitlines are connected to the bitline contacts of the memory cell selection transistors of the respective active area lines; a plurality of wordlines running perpendicular to said bitlines which are connected to the wordline contacts of the memory cell selection transistors of corresponding active area lines; and a plurality of memory cell capacitors each of which is connected to a respective rewired node contact of an associated memory cell selection transistor.

According to a third aspect of the present invention as claimed in claim 16, a memory cell comprises: a semiconductor substrate; an active area line formed in said semiconductor substrate, which active area line includes a memory cell selection transistor having a wordline contact, bitline contact, and node contact; a filled insulation trench arranged adjacent to said active area line; a rewiring stripe which rewires said node contact of said memory cell selection transistor from said active area line to above said adjacent filled insulation trench so as to form a rewired node contact; and a memory cell capacitor which is connected to said rewired node contact of an said memory cell selection transistor.

The present invention provides an integrated semiconductor memory structure which can be easily realized, e.g. by pitch doubling techniques. A rewiring of the node contacts in the first level above the semiconductor surface is made possible. Preferably, the rewiring layer is identical to the gate stack layer of peripheral support devices. According to the present invention, straight active area lines and bitlines both of which run perpendicular to the wordlines may be achieved. This leads to improved contact resistance for the nodes, as the doped silicon to metal transition is provided close to the silicon surface within the gate stack such that a large metal silicon transition area can be formed. According to the invention, the node contact which according to the state of the art was a polysilicon contact can be formed as a metal contact. Moreover, the layout according to the present invention is even suitable for a $6F^2$ cell with 2,3 F*2,3 F, where F is the critical dimension of the used technology. Since the active arealines, bitlines, and wordlines are no longer angled, one layer can be saved. As another benefit, logic-like devices can be used, as there is no self-aligned contact in the gate conductor level.

DESCRIPTION OF THE DRAWINGS

In the Figures:

FIGS. 1A-7A show a plain view of schematic layouts for illustrating a manufacturing method for an integrated semiconductor memory device ac-cording to a first embodiment of the present invention, FIGS. 1B-7B show a cross-section view alone line 2-2 of FIGS. 1A-7A of schematic layouts for illustrating a manufacturing method for an integrated semiconductor memory device ac-cording to a first embodiment of the present invention;

FIGS. 1C-7C show a cross-section view along lines 1-1 of FIGS. 1A-7A of schematic layouts for illustrating a manufacturing method for an integrated semiconductor memory device ac-cording to a first embodiment of the present invention;

FIG. 10 shows a schematic layout for illustrating an integrated semi-conductor memory device according to a third embodiment of the present invention.

In the Figures, identical reference signs denote equivalent or functionally equivalent components.

DESCRIPTION OF THE PREFERRED EMBODIMENTS

Figure 6A:
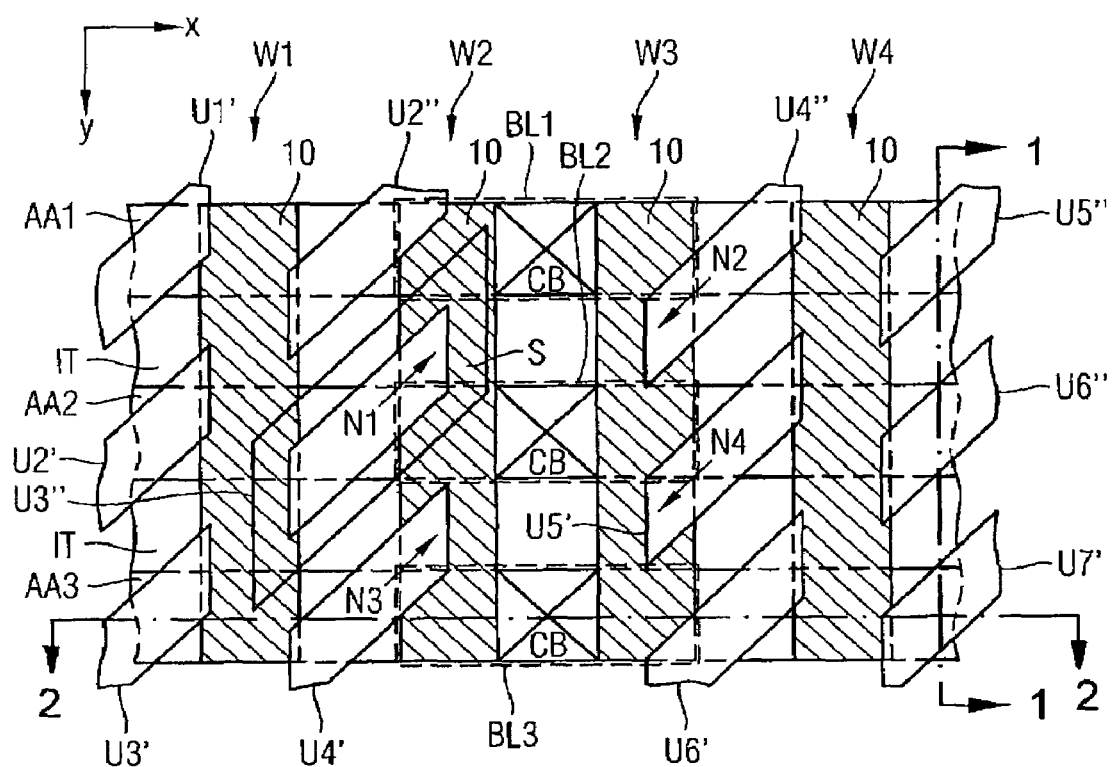
Figure 6B:
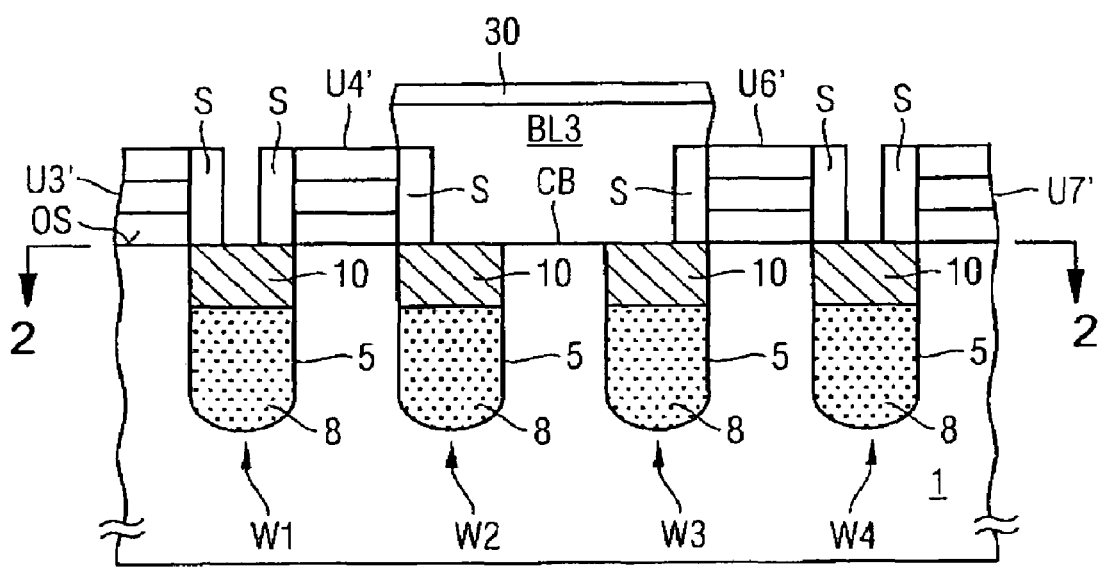
Figure 6C:
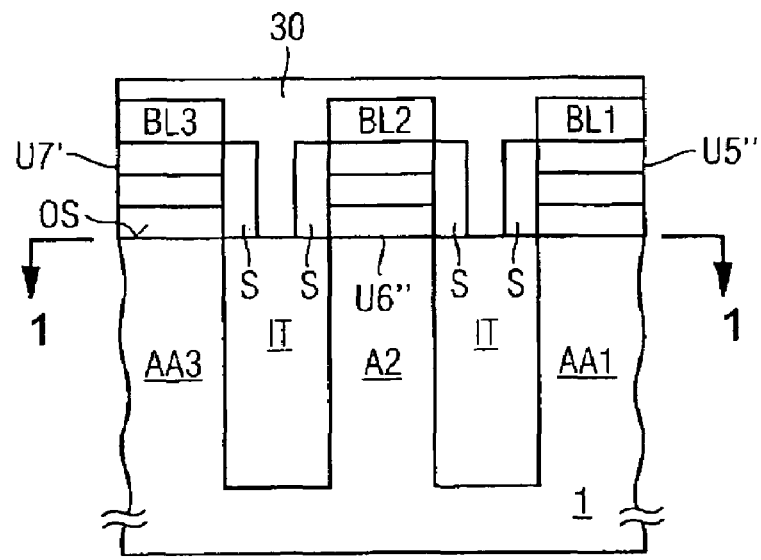
Figure 7A:
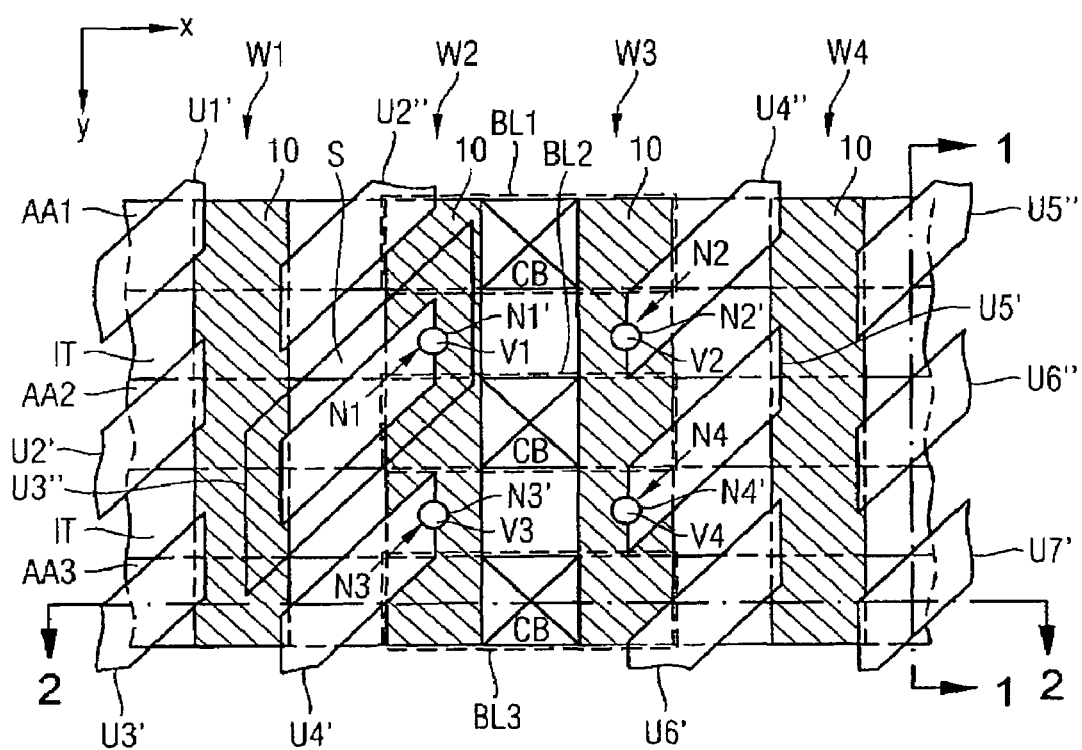
Figure 7B:
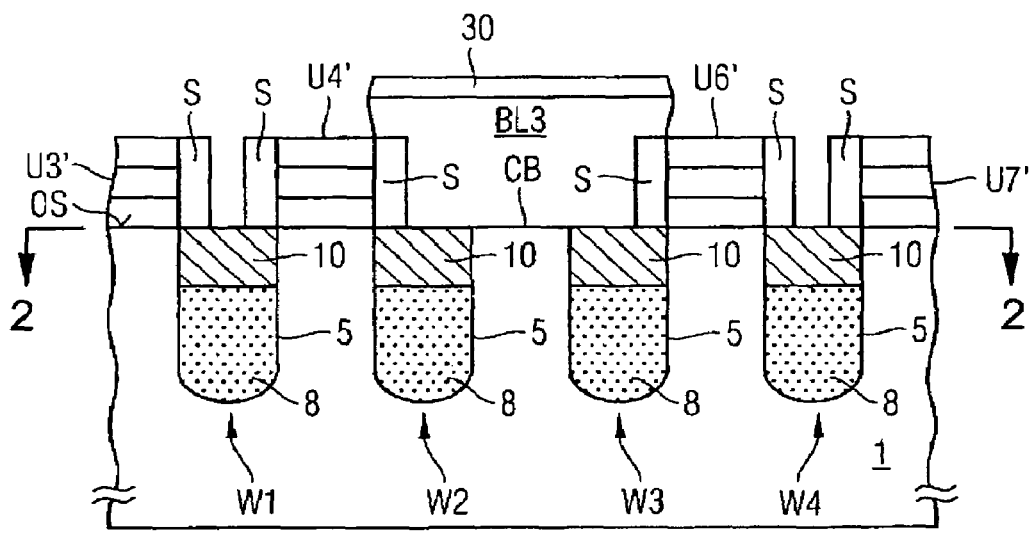
Figure 7C:
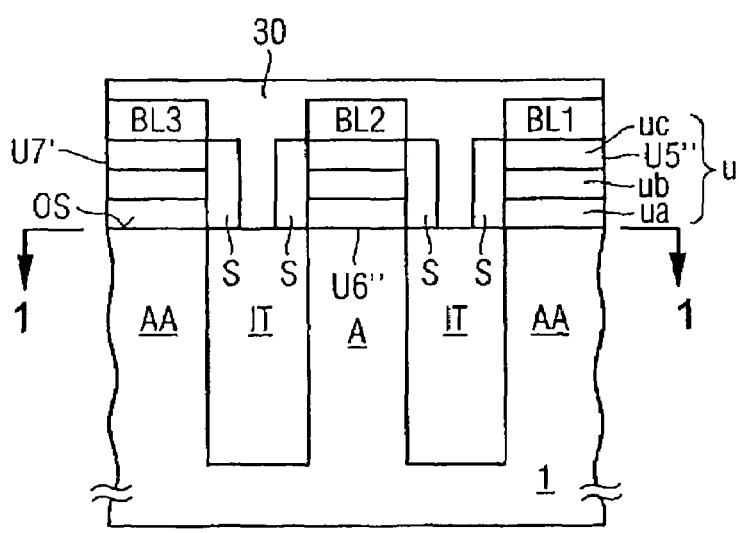
Figure 7D:
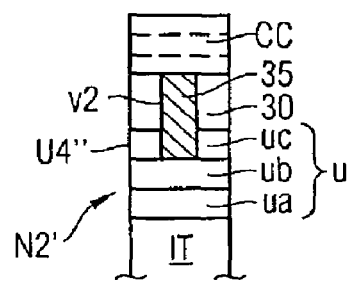
FIG. 7D shows the electrical connection of a rewired node contact to a cell capacitor according to the first embodiment of the present invention.

FIGS. 1-7 show schematic layouts for illustrating a manufacturing method for an integrated semiconductor memory device according to a first embodiment of the present invention, namely FIGS. 1A-7A as plain view, FIGS. 1B-7B as cross-section along line 2-2 of FIGS. 1A-7A, and FIGS. 1C-7C as cross-section along line 1-1 of FIGS. 1A-7A; and FIG. 7D shows the electrical connection of a rewired node contact to a cell capacitor according to the first embodiment of the present invention.

Figure 1A:
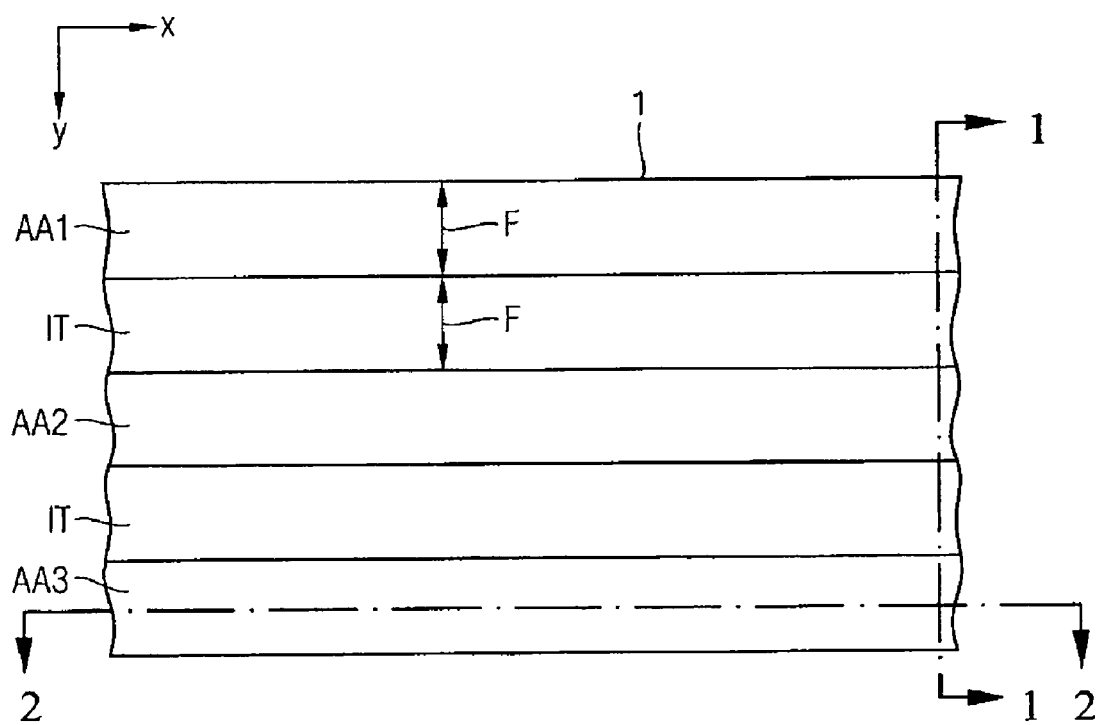
Figure 1B:
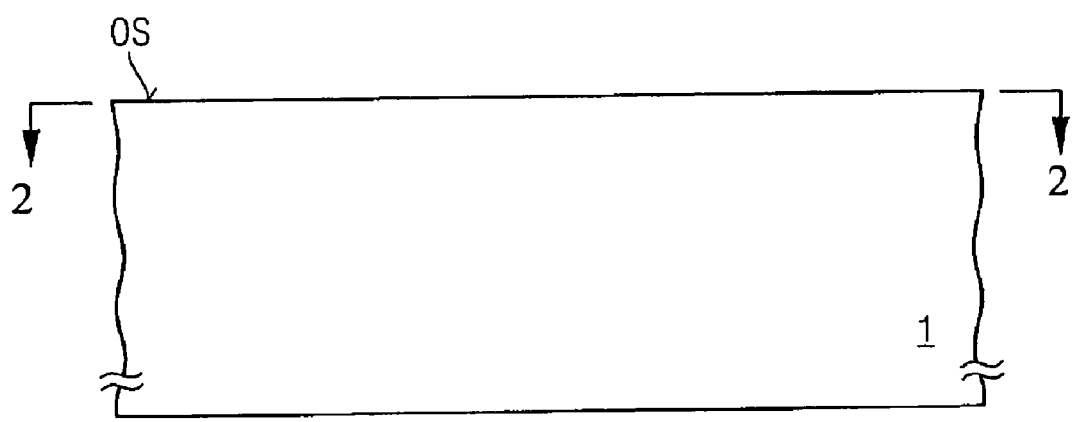
Figure 1C:
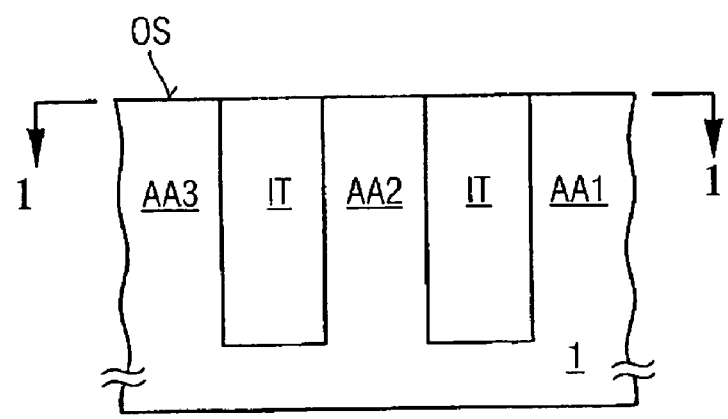

In FIG. 1A-C, reference sign 1 denotes a silicon semiconductor substrate wherein active area lines AA1, AA2, AA3 separated by insulation trenches IT filled with a dielectric substance such as silicon oxide have been formed. The active area lines AA1, AA2, AA3, and the insulation trenches IT have a width F (critical dimension of the used technology) and run in parallel along the x-direction.

Reference sign OS denotes the upper surface of the silicon semiconductor substrate 1 which is also the upper surface of the planarized insulation trenches IT which have been formed in the silicon substrate 1 by a per se known etching/filling/polishing technique.

Figure 2A:
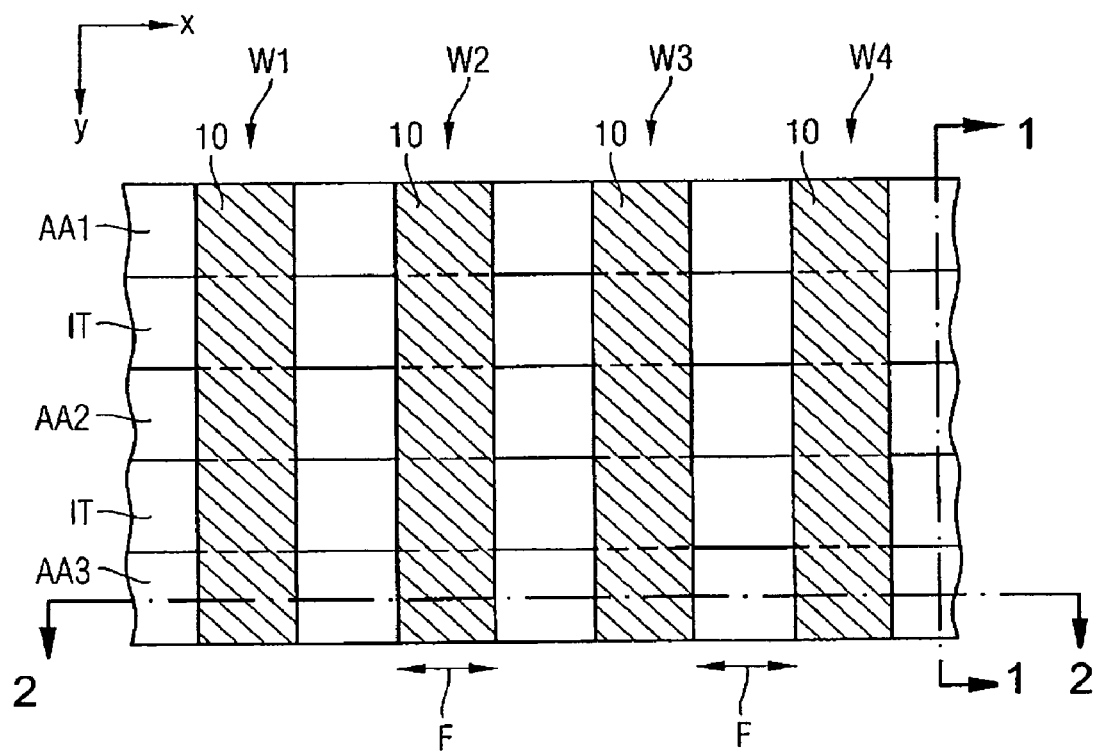
Figure 2B:
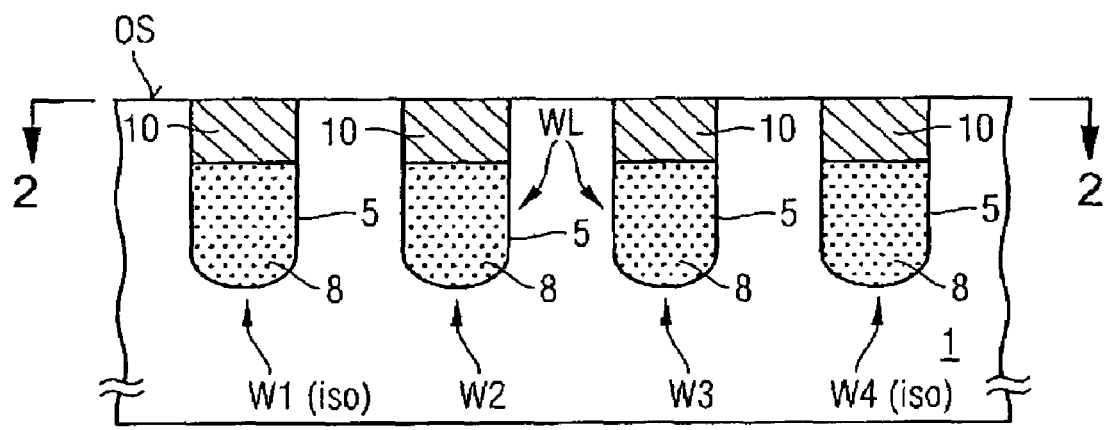
Figure 2C:
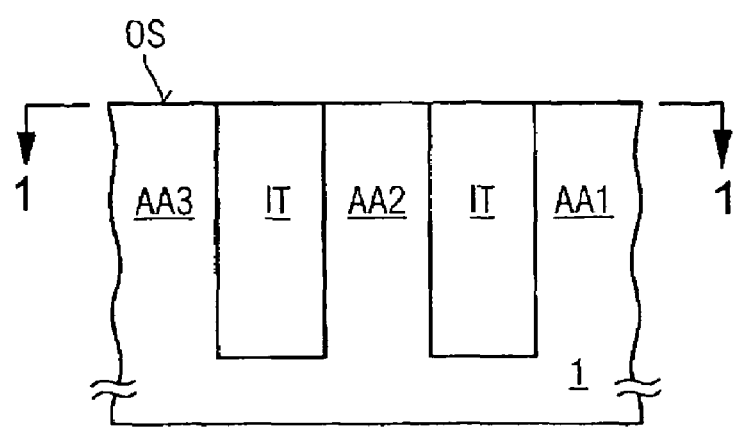

In a subsequent process sequence which is illustrated in FIG. 2A-C, buried wordlines W1, W2, W3, W4 are formed in the silicon semiconductor substrate 1 forming respective wordline contact WC of the individual memory cell selection transistors having a respective wordline contact WC, node contact (see below) and bitline contact (see below). The buried wordlines W1, W2, W3, W4 comprise a gate dielectric 5, e.g. made of thermal silicon oxide or a high-k dielectric material, a conductive fill 8, e.g. made of polysilicon or metals like W, Ti, TiN, Ta, TaN or others or suicides, and an insulating cap 10, e.g. made of silicon oxide. The buried wordlines W1, W2, W3, W4 run in parallel along the y-direction and are separated by intervening lines which consist of alternating blocks of the insulation trenches IT and the silicon substrate 1 (to be later the bitline contacts). Both the wordlines W1, W2, W3, W4 and the intervening lines have a width of F.

Moreover, it should be noted, that according to the memory cell concept of this embodiment, the wordlines W2, W3 are active wordlines, whereas the wordlines W1, W4 are used for isolation. This scheme is repeated periodically in x-direction, i.e. two active wordlines, one wordline for isolation, two active wordlines, one wordline for isolation, etc.

However, it should be mentioned here that the use of wordlines for isolation is optional and the present invention is not limited thereto, as will become readily apparent for the average skilled person.

It should also be noted here, if F is the smallest feature size which can be lithographically achieved, by the use of double-patterning techniques, e.g. line by fill and/or line by spacer, to structure the various layers, it is possible to reduce the actual smallest feature size to below F.

Figure 3A:
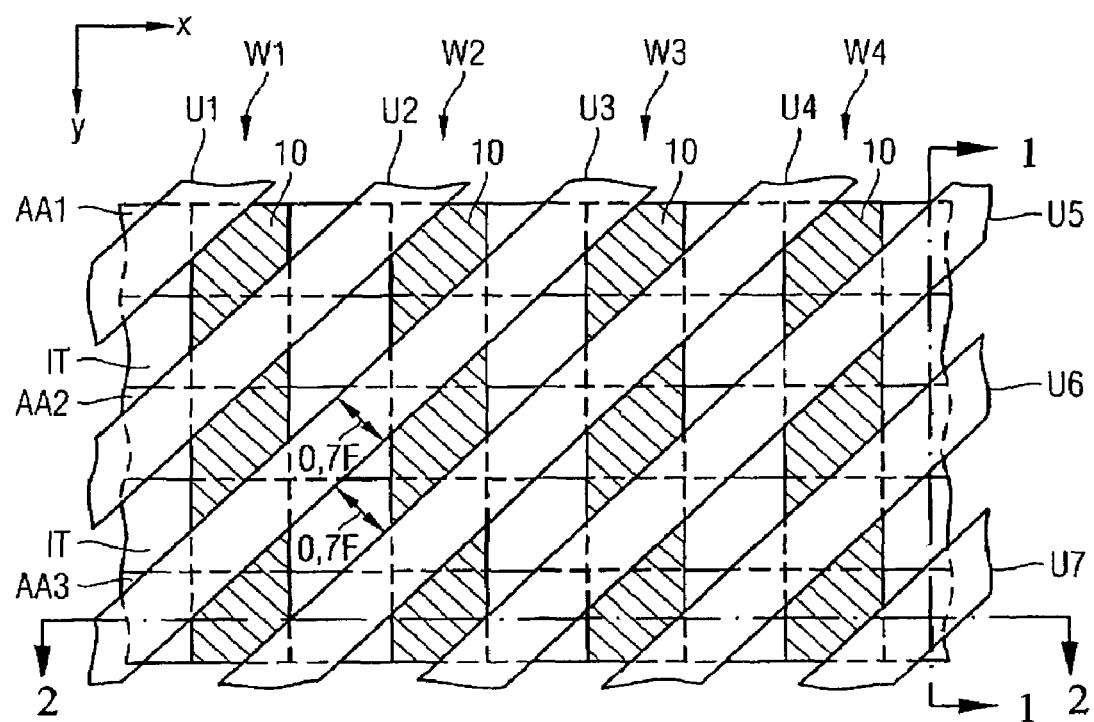
Figure 3B:
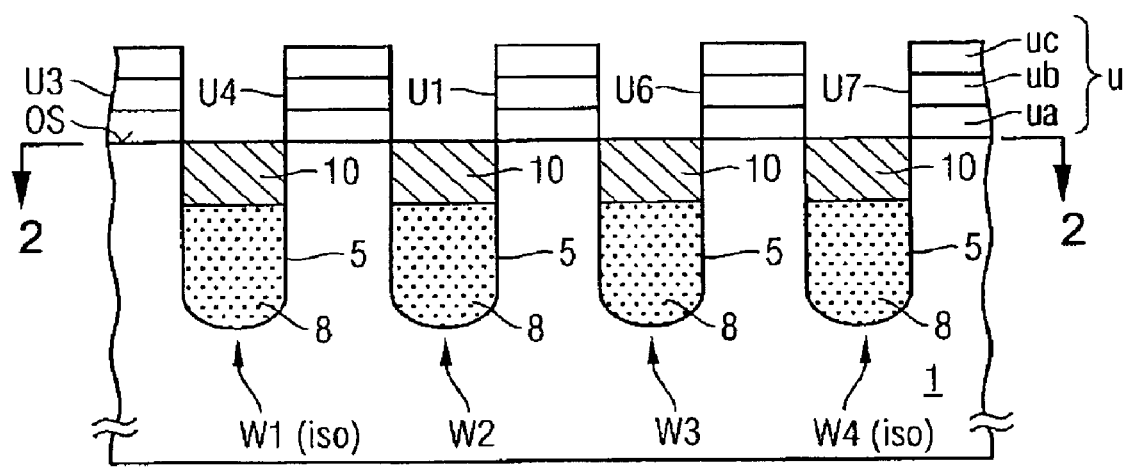
Figure 3C:
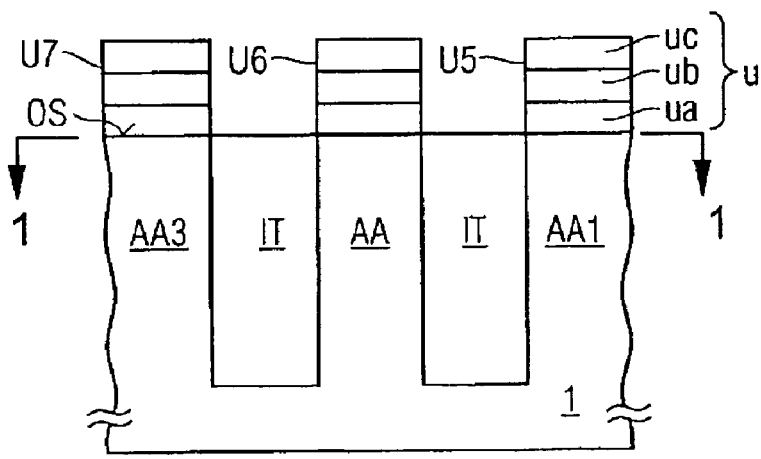

In a subsequent process step, which is illustrated in FIG. 3A-C, a rewiring layer u is formed on the upper surface OS of the silicon semiconductor substrate 1, i.e., in the first level above the silicon semiconductor substrate 1.

In this first embodiment, the rewiring layer u is formed by the gate stack layer of the peripheral devices and comprises a lower polysilicon layer ua, a middle tungsten layer ub and an upper nitride cap layer uc. It should be mentioned that in the periphery a gate dielectric layer is located below the polysilicon layer ua which gate dielectric layer is removed in the memory cell array by a block mask technique where the gate stack layer serves as rewiring layer u and not as gate layer. However, it should be noted here that as materials for the gate stack layer, any other material combination known in the art can be used.

After formation of the rewiring layer u, the layer u is structured into rewiring lines u1, u2, u3, u4, u5, u6, u7 running in parallel and forming an angle of 45° with the x-direction. For structuring the rewiring lines u1, u2, u3, u4, u5, u6, u7, a sub 1F/sub 1F technique may be applied, for example a line by fill and/or line by spacer technique in order to form the rewiring lines u1, u2, u3, u4, u5, u6, u7 and the intervening spaces such that they have a width of 0,7F. This is necessary because of the angle of 45° formed with the x-direction.

Figure 4A:
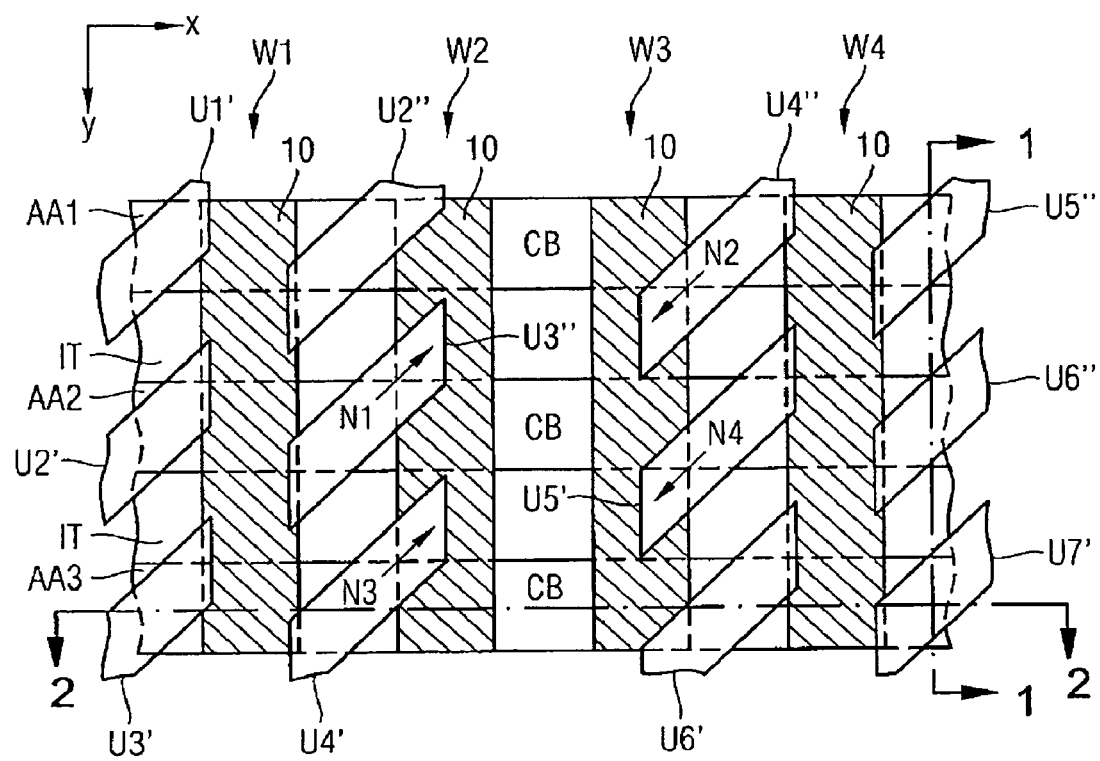
Figure 4B:
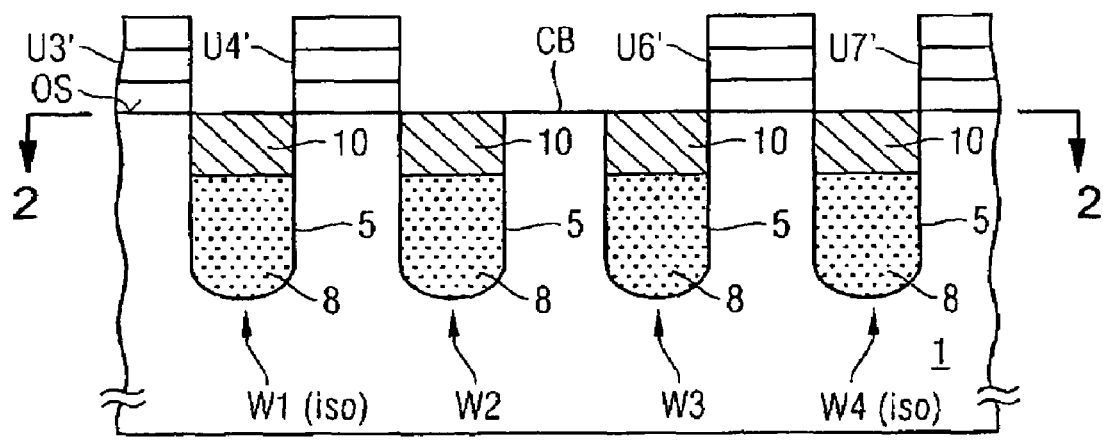
Figure 4C:
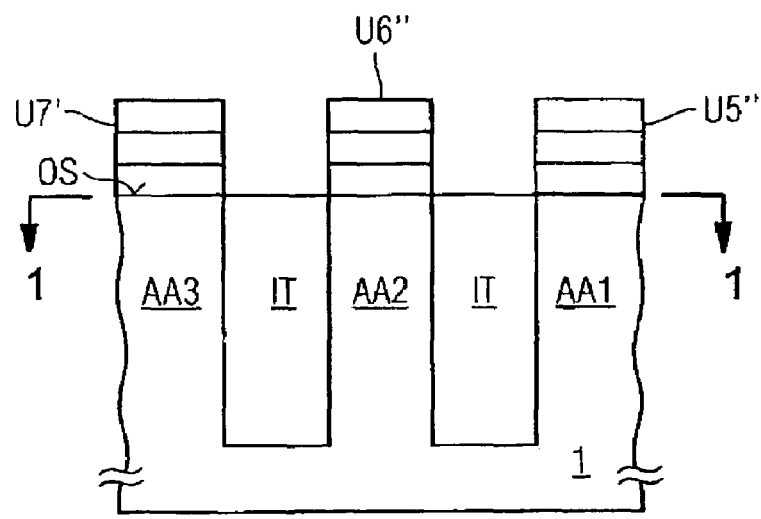

In a next process step, which is illustrated in FIG. 4A-C, the rewiring lines are cut into rewiring stripes u1', u2', u2", u3', u3", u4', u4", u5', u5", u6', u6", u7' by a sub-lithographical line mask technique, e.g. line-by-fill and/or line by spacer. Particularly, the cut-off pieces of rewiring lines u1, u2, u3, u4, u5, u6, u7 running above the wordlines W1, W4 have a dimension of less than F.

In FIG. 4A-C newly introduced reference signs CB denote areas for bitline contacts and newly introduced reference signs N1 N4 denote original node contacts lying on the active area AA1, AA2, AA3, respectively. Each rewiring stripe u1', u2', u2", u3', u3", u4', u4", u5', u5", u6', u6", u7' rewires an original node contact to besides the associated active area line under an angle of 45° onto an insulation trench IT. Particularly, this is shown here for the original node contacts N1, N2, N3, N4 where the arrows show the rewiring direction.

Figure 5A:
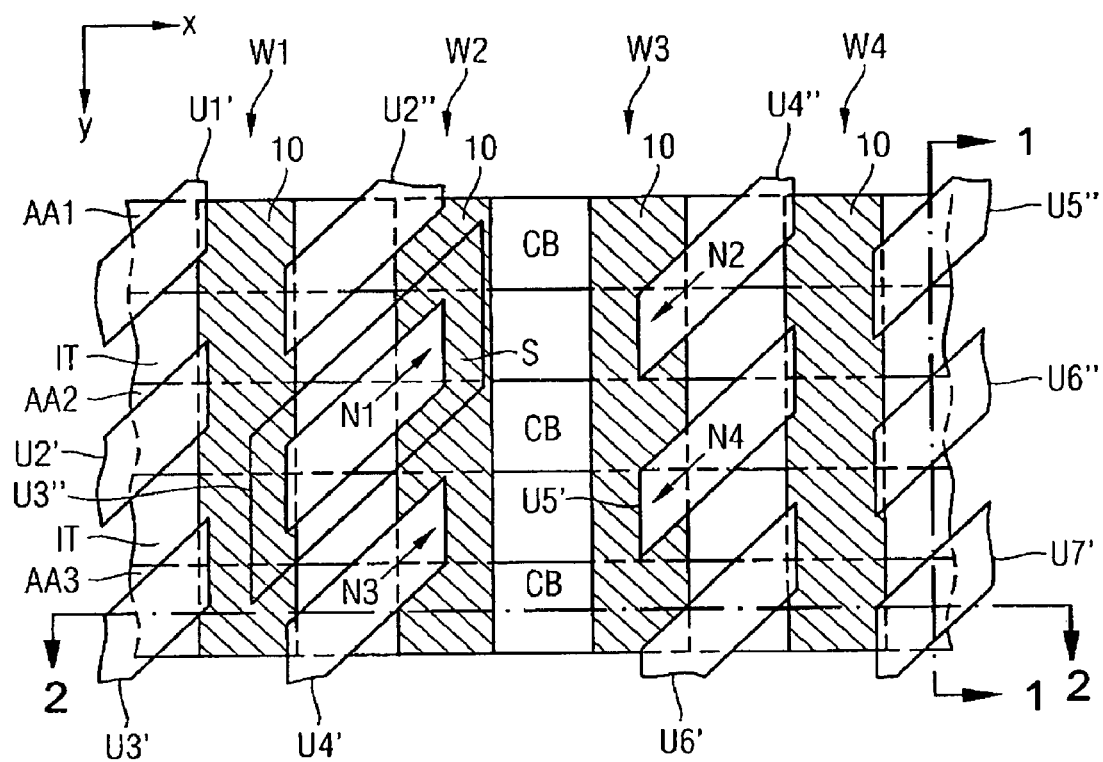
Figure 5B:
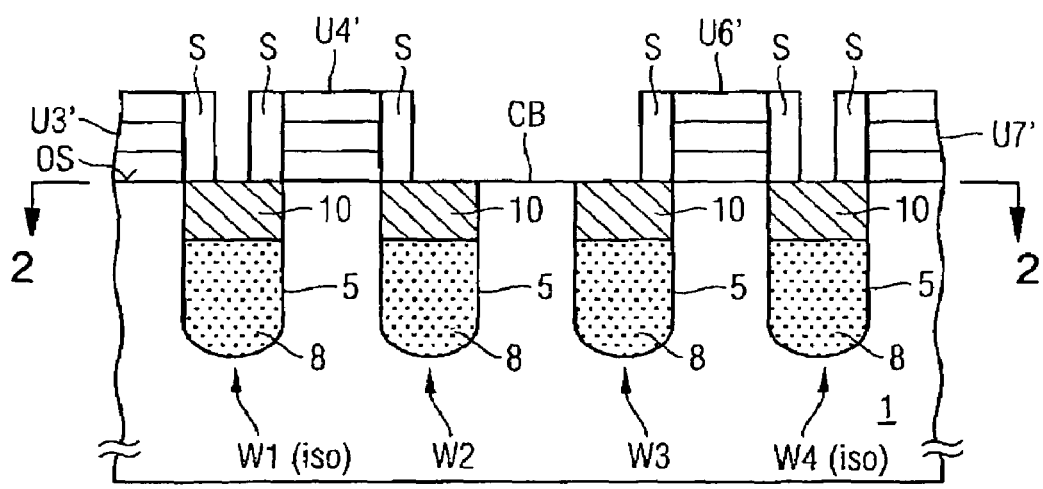
Figure 5C:
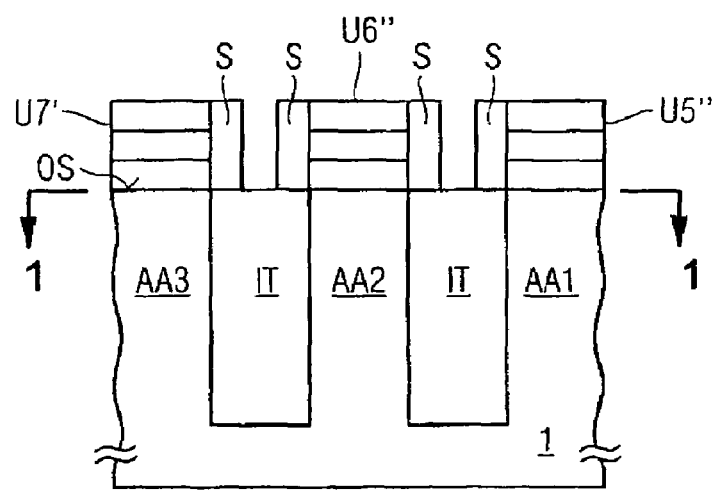

As may be obtained from FIG. 5A-C, the rewiring stripes u1', u2', u2", u3', u3", u4', u4", u5', u5", u6', u6", u7' are then provided with a surrounding insulating spacer S. e.g. made of silicon oxide, by a per se known spacer deposition/etch technique. For the sake of simplicity, in FIG. 5A the spacer S is only shown for the rewiring stripe u3".

It should be mentioned that the spacer S provides electrical isolation for the sidewalls of the rewiring stripes u1', u2', u2", u3', u3", u4', u4", u5', u5", u6', u6", u7' and for the so far uncovered area of the original node contacts N1, N2, N3, N4, . . . on the active area lines AA1, AA2, AA3. However, the spacer S leaves the bitline contacts GB lying on the active area lines AA1, AA2, AA3, exposed as may be particularly be obtained from FIG. 5B.

As may be obtained from FIG. 6A-C, bitlines BL1, BL2, BL3, e.g. made of tungsten or metals like W, Ti, TiN, Ta, TaN or others, and having (not shown) insulating caps for encapsulation allowing for self-aligned node contacts are now formed by a deposition/etch technique. Said bitlines BL1, BL2, BL3 run above the active area lines AA1, AA2, AA3, respectively, and are aligned therewith in their width F and direction x. For reasons of clarity, only a partial portion of the bitlines BL1, BL2, BL3 is shown in FIG. 6A-B, however, it should be realized that the bitlines completely cover the active area lines AA1, AA2, AA3 etc., as may be obtained from FIG. 6C.

In particular, by applying this spacer technique for insulating the rewiring stripes u1', u2', u2", u3', u3", u4', u4", u5', u5", u6', u6", u7' and leaving the bitline contacts CB lying on the active area lines AA1, AA2, AA3, exposed, the critical bitline contact etching procedure of prior art designs can be avoided.

In a next process step which is also illustrated in FIG. 6A-C, an insulation/planarization layer 30, e.g. made of silicon oxide, is deposited over the entire structure and subjected to a chemical-mechanical polishing procedure which leaves a planarized surface of the layer 30 located above the bitlines BL, BL2, BL3.

Further with respect to FIG. 7A-D, a self aligned node contact hole etch step is performed for forming vias v1, v2, v3, v4 that expose the rewired node contacts N1' (rewired from N1), N2' (rewired from N2), N3' (rewired from N3), N4' (rewired from N4) etc. It should be noted that the vias v1, v2, v3, v4 of the rewired node contacts N1', N2', N3', N4' extend to a depth where they expose the upper surface of the middle layer ub made of tungsten of the rewiring layer u. This is schematically shown in FIG.7D which shows a cross-section of rewired node contact N2'. Also schematically shown in FIG. 7D is that after filling the contact hole v2 etc. of the rewired node contact N2' etc. with an electrically conductive contact material 35, stacked cell capacitors CC are formed in contact with the rewired node contacts N2' etc., thus completing the memory cell array.

Figure 8:
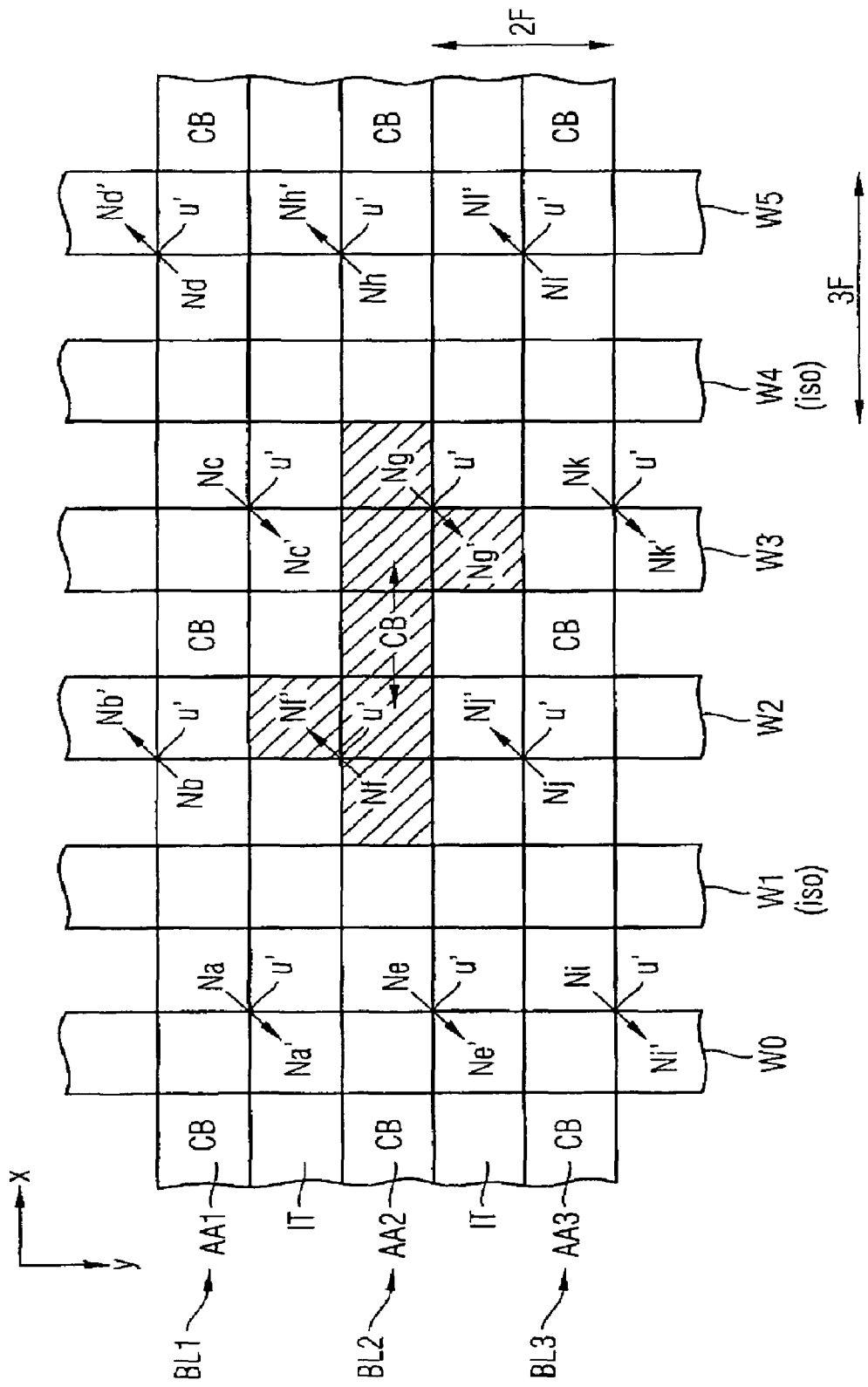
FIG. 8 shows a schematic layout for illustrating the integrated semi-conductor memory device according to the first embodiment of the present invention.

FIG. 8 shows a schematic layout for illustrating the integrated semiconductor memory device according to the first embodiment of the present invention.

In FIG. 8, the general rewiring concept explained above with respect to FIGS. 1A-7D, is schematically depicted for bitlines BL1, BL2, BL3 running along the x-direction and having a width of F with intervening insulation trenches IT also having a width of F. Wordlines W0, W1, W2, W3, W4, W5 each having also a width of F with intervening spaces also having a Width F thus form a memory cell array having a cell-size of $6F_2$. The arrows in FIG. 8 denote the rewiring stripes u' which rewire original node contacts Na to Nl from the active area lines AA1, AA2, AA3 to above the intervening insulation trenches IT under an angle of 45° in order to form rewired node contacts Na'-Ni'.

It should be noted here that the rewiring concept of the present invention is not limited to the cell concept introduced in FIGS. 1A-7D and 8, but can be modified in various ways which are readily apparent for the skilled persons.

Figure 9:
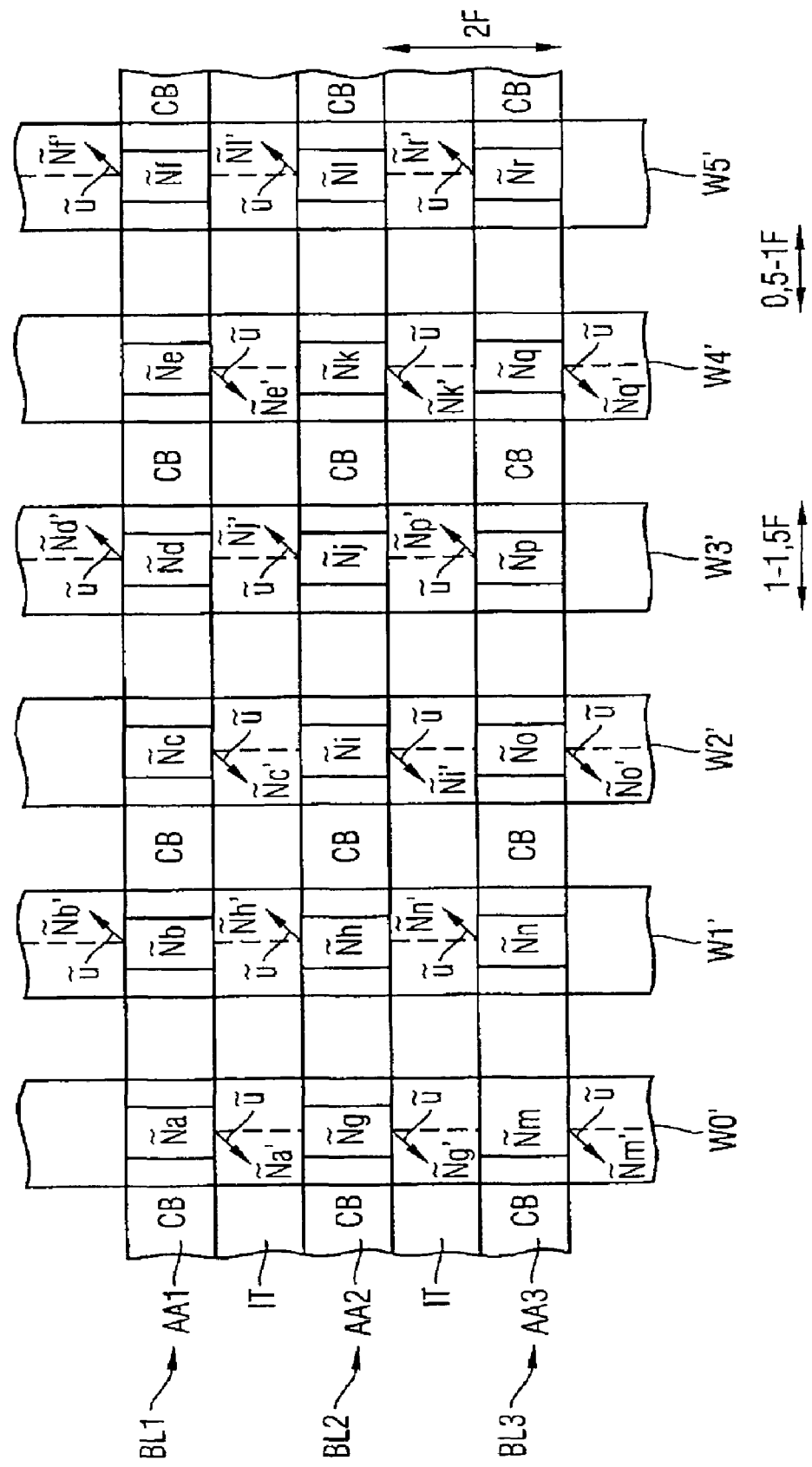
FIG. 9 shows a schematic layout for illustrating an integrated semi-conductor memory device according to a second embodiment of the present invention.

FIG. 9 shows a schematic layout for illustrating an integrated semiconductor memory device according to a second embodiment of the present invention.

According to the second embodiment illusttated in FIG. 9, the buried wordlines W0', W1', W2', W3', W4', W5' have a width of between 1 and 1,5 F and are designed such that they surround pillar-like node contacts Na Nr. The design of the active areas AA1, AA2, AA3 regarding width, intervening insulation trenches IT and bitline contacts CB is the same as in the first embodiment shown in FIG. 8. The distance between adjacent wordlines W0', W1', W2', W3', W4', W5' is between 0,5 and IF. Thus, memory cell arrays according to the second embodiment can have a cell-size of $6F_2$ or below.

The arrows in FIG. 8 denote the rewiring stripes û which rewire original node contacts Ña to Ñr from the active area lines AA1, AA2, AA3 to above the intervening insulation trenches IT under an angle of 45° in order to form rewired node contacts Ña' to Ñr' which is the same rewiring concept as in the first embodiment shown in FIG. 8.

FIG. 10 shows a schematic layout for illustrating an integrated semiconductor memory device according to a third emb6diment of the present invention.

As becomes apparent from FIG. 10, the design of the third embodiment also provides pillar-like wordline-surrounded original node contacts Ña to Ñr, however, the rewiring concept using the rewiring stripes û is performed differently, i.e. all rewiring stripes û provide a rewiring into the same direction to above a respective bitline BL1, BL2, BL3 in order to form rewired node contacts Ña' to Ñr', the cell-size according to the third embodiment of FIG. 10 being 2,3 F*2,3 F=$6F_2$ or below.

Although the present invention has been described with reference to a preferred embodiment, it is not limited thereto, but can be modified in various manners which are obvious for a person skilled in the art. Thus, it is intended that the present invention is only limited by the scope of the claims attached herewith.

In particular, the present invention is also not limited to buried wordlines and an rewiring angle of 45°.

What is claimed is:

1. A manufacturing method for an integrated semiconductor memory device comprising the steps of:
   providing a semiconductor substrate;
   forming a plurality of active area lines in said semiconductor substrate, each of which active area lines includes a plurality of memory cell selection transistors having a respective wordline contact, bitline contact, and node contact;
   forming a plurality of filled insulation trenches arranged between said active area lines;
   forming a plurality of wordlines running perpendicular to said active area lines and being connected to the wordline contacts of the memory cell selection transistors of corresponding active area lines;
   forming a plurality of rewiring stripes each of which rewires an associated node contact of a memory cell selection transistor from an active area line to above a neighboring filled insulation trench so as to form a respective rewired node contact;
   forming a plurality of bitlines being aligned with an running above said active area lines and being connected to the bitline contacts of the memory cell selection transistors of the respective active area lines; and
   forming a plurality of memory cell capacitors each of which is connected to a respective rewired node contact of an associated memory cell selection transistor.

2. The method of claim 1, wherein the step of forming plurality of rewiring stripes includes:
   forming a rewiring layer on said substrate;
   structuring said rewiring layer into rewiring lines which rewiring lines form an angle of about 45° with said active area lines;
   cutting-off pieces of said rewiring lines so as to form said rewiring stripes.

3. The method of claim 1, wherein said rewiring layer is made of a peripheral device gate stack layer and compromises at least one conductive layer and an insulating cap layer.

4. The method of claim 3, wherein an insulating sidewall spacer is formed on said rewiring stripes such that the bitline contacts of the memory cell selection transistors are exposed and the bitline contacts are formed in self-aligned way with the bitlines.

5. The method of claim 4, wherein an insulating layer is deposited after formation of the bitlines and planarized to above a level of the bitlines, whereafter vias are formed which expose said rewired node contacts; and then said cell capacitors are formed on said insulating layer in electrical contact with said rewired node contacts.

6. The method of claim 1, wherein said rewiring stripes are formed by a sub-lithographical technique.

7. The method of claim 1, wherein said rewiring stripes are formed in the first level above said substrate.

8. The method of claim 1, wherein said wordlines are formed as buried wordlines.

9. The method of claim 1, wherein said memory cell are formed as having a cell size of $6F^2$ or below, where F is the critical dimension of the used technology.

10. An integrated semiconductor memory device compromising:
- a semi-conductor substrate;
- a plurality of active area lines formed in said semiconductor substrate, each of which active area lines includes a plurality of memory cell selection transistors having a respective wordline contract, bitline contact, and node contract;
- a plurality of filled insulation trenches arranged between said active area lines;
- a plurality of rewiring stripes each of which rewires an associated node contact of a memory cell selection transistor from an active area line to above a neighboring filled insulation trench so as to form a respective rewired node contact;
- a plurality of bitlines being aligned with and running above said active area lines and above the rewiring stripes, the bitlines connected to the bitline contacts of the memory cell selection transistors of the respective active area lines;
- a plurality of wordlines running perpendicular to said bitlines which are connected to the wordlines contacts of the memory cell selection transistors of corresponding active area lines; and
- a plurality of memory cell capacitors each of which is connected to a respective rewired node contact of an associated memory cell selection transistor.

11. The device of claim 10, wherein said rewiring layer is made of a peripheral device gate stack layer and comprises at least one conductive layer and an insulating cap layer.

12. The device of claim 11, wherein an insulating sidewall spacer is formed on said rewiring stripes.

13. The device of claim 11, wherein an insulating layer is provided which insulation layer is planarized to above a level of the bitlines, and said cell capacitors are formed on said insulating layer in electrical contact with said rewired node contacts via corresponding vias.

14. The device of claim 10, wherein said rewiring stripes are formed in the first level above said substrate.

15. The device of claim 10, wherein said wordlines are formed as buried wordlines.

16. A memory cell compromising:
- a semiconductor substrate;
- an active area line formed in said semiconductor substrate, which active area line includes a memory cell selection transistor having a wordline contact, bitline contact, and node contact;
- a filled insulation trench arranged adjacent to said active area line;
- a rewiring stripe which rewires said node contact of said memory cell selection transistor from said active area line to above said adjacent filled insulation trench so as to form a rewired node contact; and
- a memory cell capacitor which is connected to said rewired node contact of an said memory cell selection transistor.

17. Integrated circuit device compromising at least one memory cell as defined in claim 16.

* * * * *